United States Patent
Igeta et al.

(10) Patent No.: US 12,135,457 B2
(45) Date of Patent: Nov. 5, 2024

(54) LIQUID CRYSTAL OPTICAL ELEMENT AND METHOD FOR MANUFACTURING THE SAME

(71) Applicants: Japan Display Inc., Tokyo (JP); OSAKA UNIVERSITY, Suita (JP)

(72) Inventors: Koichi Igeta, Tokyo (JP); Shinichiro Oka, Tokyo (JP); Yasushi Tomioka, Tokyo (JP); Junji Kobashi, Tokyo (JP); Hiroyuki Yoshida, Suita (JP)

(73) Assignees: Japan Display Inc., Tokyo (JP); OSAKA UNIVERSITY, Suita (JP)

( * ) Notice: Subject to any disclaimer, the term of this patent is extended or adjusted under 35 U.S.C. 154(b) by 0 days.

(21) Appl. No.: 18/430,928

(22) Filed: Feb. 2, 2024

(65) Prior Publication Data

US 2024/0176074 A1     May 30, 2024

Related U.S. Application Data

(63) Continuation of application No. PCT/JP2022/021569, filed on May 26, 2022.

(30) Foreign Application Priority Data

Aug. 4, 2021    (JP) ................. 2021-128317

(51) Int. Cl.
     *G02B 6/27*         (2006.01)
     *G02F 1/13*         (2006.01)

(52) U.S. Cl.
     CPC .................. *G02B 6/2726* (2013.01)

(58) Field of Classification Search
     CPC .......... G02B 6/2726; G02F 1/13; G02F 17/13
     See application file for complete search history.

(56) References Cited

U.S. PATENT DOCUMENTS

| | | |
|---|---|---|
| 2015/0277126 A1 | 10/2015 | Hirano et al. |
| 2016/0349517 A1 | 12/2016 | Miyasaka et al. |
| 2017/0192244 A1 | 7/2017 | Shinohara et al. |
| 2019/0250457 A1 | 8/2019 | Nishimura et al. |
| 2020/0326579 A1 | 10/2020 | Sato et al. |
| 2021/0223448 A1 | 7/2021 | Sato et al. |

(Continued)

FOREIGN PATENT DOCUMENTS

| | | |
|---|---|---|
| CN | 103236462 A | 8/2013 |
| JP | 2009-300662 A | 12/2009 |
| JP | 2015-184560 A | 10/2015 |

(Continued)

OTHER PUBLICATIONS

International Search Report and Written Opinion issued on Jul. 12, 2022 in corresponding application No. PCT/JP2022/021569; 14 pages.

*Primary Examiner* — Joseph L Williams
(74) *Attorney, Agent, or Firm* — Maier & Maier, PLLC (57) ABSTRACT

According to one embodiment, a liquid crystal optical element includes an optical waveguide including a first main surface and a second main surface opposed to the first main surface, an alignment film disposed on the second main surface, a liquid crystal layer which overlaps the alignment film, which includes cholesteric liquid crystals, and which reflects at least part of light incident through the optical waveguide toward the optical waveguide, and a transparent first protective layer which overlaps the liquid crystal layer, and which is formed of a water-soluble polymer or a fluorine-based resin.

12 Claims, 9 Drawing Sheets

(56) References Cited

U.S. PATENT DOCUMENTS

2023/0335660 A1 10/2023 Yoshida

FOREIGN PATENT DOCUMENTS

| | | |
|---|---|---|
| JP | 2016-114929 A | 6/2016 |
| JP | 2017-522601 A | 8/2017 |
| JP | 2018-116209 A | 7/2018 |
| WO | 2015/125794 A1 | 8/2015 |
| WO | 2016/019123 A1 | 2/2016 |
| WO | 2018/079854 A1 | 5/2018 |
| WO | 2019/131966 A1 | 7/2019 |
| WO | 2020/075738 A1 | 4/2020 |
| WO | 2021/132615 A1 | 7/2021 |

LIQUID CRYSTAL OPTICAL ELEMENT AND METHOD FOR MANUFACTURING THE SAME

CROSS-REFERENCE TO RELATED APPLICATIONS

This application is a Continuation Application of PCT Application No. PCT/JP2022/021569, filed May 26, 2022 and is based upon and claims the benefit of priority from Japanese Patent Application No. 2021-128317, filed Aug. 4, 2021, the entire contents of all of which are incorporated herein by reference.

FIELD

Embodiments described herein relate generally to a liquid crystal optical element and a method for manufacturing the same.

BACKGROUND

For example, liquid crystal polarization gratings for which liquid crystal materials are used have been proposed. Such a liquid crystal polarization grating divides incident light into zero-order diffracted light and first-order diffracted light, when light of a wavelength λ is incident thereon. In optical elements for which liquid crystal materials are used, it is necessary to adjust parameters such as the refractive anisotropy Δn of a liquid crystal layer (difference between the refractive index ne for extraordinary light and the refractive index no for ordinary light of the liquid crystal layer) and the thickness d of the liquid crystal layer, as well as the grating period.

DETAILED DESCRIPTION

Embodiments described herein aim to provide a liquid crystal optical element which can achieve desired reflective performance and a method for manufacturing the same.

In general, according to one embodiment, a liquid crystal optical element comprises an optical waveguide comprising a first main surface and a second main surface opposed to the first main surface, an alignment film disposed on the second main surface, a liquid crystal layer which overlaps the alignment film, which comprises cholesteric liquid crystals, and which reflects at least part of light incident through the optical waveguide toward the optical waveguide, and a transparent first protective layer which overlaps the liquid crystal layer, and which is formed of a water-soluble polymer or a fluorine-based resin.

According to another embodiment, a method for manufacturing a liquid crystal optical element, comprises forming an alignment film on an optical waveguide, forming a liquid crystal layer comprising cholesteric liquid crystals on the alignment film, and applying an aqueous solution prepared by dissolving polyvinyl alcohol in pure water, to the liquid crystal layer, and then drying the aqueous solution to form a first protective layer.

According to the embodiments, a liquid crystal optical element which can achieve desired reflective performance and a method for manufacturing the same can be provided.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

In the drawings, an X-axis, a Y-axis, and a Z-axis orthogonal to each other are described to facilitate understanding as necessary. A direction along the Z-axis is referred to as a Z direction or a first direction A1, a direction along the Y-axis is referred to as a Y direction or a second direction A2, and a direction along the X-axis is referred to as an X direction or a third direction A3. A plane defined by the X-axis and the Y-axis is referred to as an X-Y plane, a plane defined by the X-axis and the Z-axis is referred to as an X-Z plane, and a plane defined by the Y-axis and the Z-axis is referred to as a Y-Z plane.

Embodiment 1

Figure 1:
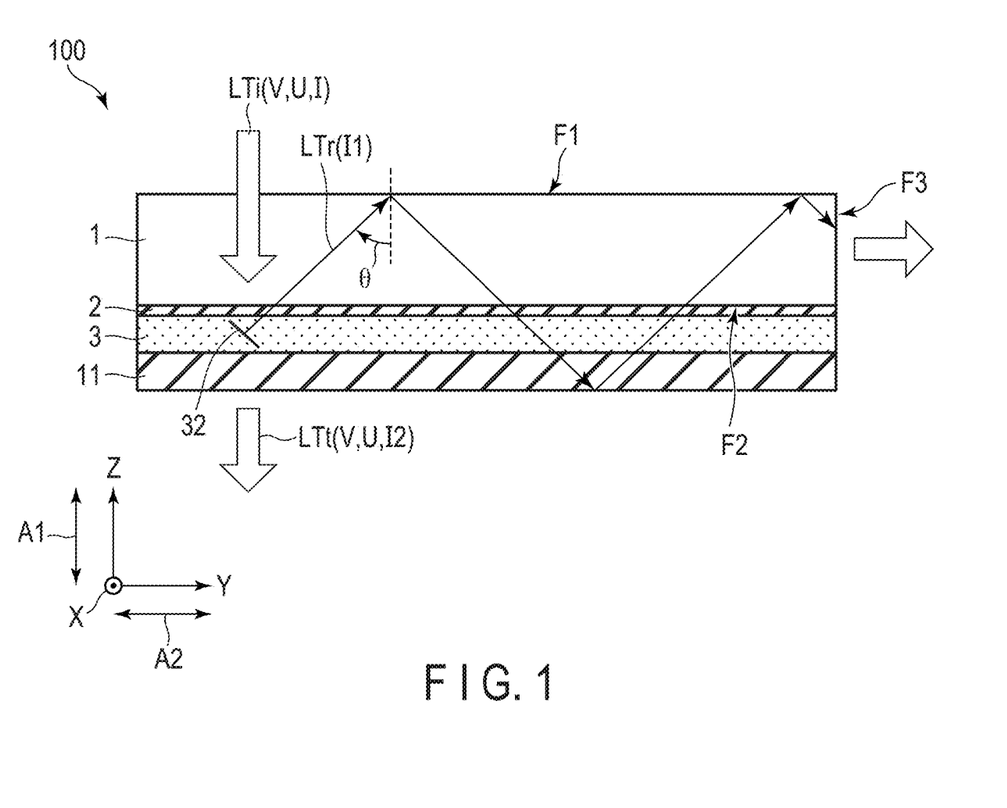
FIG. 1 is a cross-sectional view schematically illustrating a liquid crystal optical element 100 according to Embodiment 1.

FIG. 1 is a cross-sectional view schematically illustrating a liquid crystal optical element 100 according to Embodiment 1.

The liquid crystal optical element 100 comprises an optical waveguide 1, an alignment film 2, a liquid crystal layer 3, and a first protective layer 11.

The optical waveguide 1 is composed of a transparent member that transmits light, for example, a transparent glass plate or a transparent synthetic resin plate. The optical waveguide 1 may be composed of, for example, a transparent synthetic resin plate having flexibility. The optical waveguide 1 can assume an arbitrary shape. For example, the optical waveguide 1 may be curved. The refractive index of the optical waveguide 1 is greater than, for example, the refractive index of air. The optical waveguide 1 functions as, for example, a windowpane.

In the present specification, "light" includes visible light and invisible light. For example, the wavelength of the lower limit of the visible light range is greater than or equal to 360 nm but less than or equal to 400 nm, and the wavelength of the upper limit of the visible light range is greater than or equal to 760 nm but less than or equal to 830 nm. Visible light includes a first component (blue component) of a first wavelength band (for example, 400 nm to 500 nm), a second component (green component) of a second wavelength band (for example, 500 nm to 600 nm), and a third component (red component) of a third wavelength band (for example, 600 nm to 700 nm). Invisible light includes ultraviolet rays of a wavelength band shorter than the first wavelength band and infrared rays of a wavelength band longer than the third wavelength band.

In the present specification, to be "transparent" should preferably be to be colorless and transparent. Note that to be "transparent" may be to be translucent or to be colored and transparent.

The optical waveguide 1 is formed into the shape of a flat plate along the X-Y plane, and comprises a first main surface F1, a second main surface F2, and a side surface F3. The first main surface F1 and the second main surface F2 are surfaces substantially parallel to the X-Y plane and are opposed to each other in the first direction A1. The side surface F3 is a surface extending in the first direction A1. In the example illustrated in FIG. 1, the side surface F3 is a surface substantially parallel to the X-Z plane, but the side surface F3 includes a surface substantially parallel to the Y-Z plane.

The alignment film 2 is disposed on the second main surface F2. The alignment film 2 is a horizontal alignment film having alignment restriction force along the X-Y plane. The alignment film 2 is formed of a transparent material, for example, polyimide.

The liquid crystal layer 3 overlaps the alignment film 2 in the first direction A1. That is, the alignment film 2 is located between the optical waveguide 1 and the liquid crystal layer 3, and contacts the optical waveguide 1 and the liquid crystal layer 3. The liquid crystal layer 3 reflects at least part of light LTi incident from the first main surface F1 side toward the optical waveguide 1. For example, the liquid crystal layer 3 comprises cholesteric liquid crystals which reflect at least one of first circularly polarized light and second circularly polarized light that is circularly polarized in the opposite direction to that of first circularly polarized light, of light LTi incident through the optical waveguide 1. While the cholesteric liquid crystals will be described in detail later, a cholesteric liquid crystal turning in one direction forms a reflective surface 32 which reflects circularly polarized light corresponding to its turning direction, of light of a specific wavelength.

First circularly polarized light and second circularly polarized light reflected by the liquid crystal layer 3 are, for example, infrared rays, but may be visible light or ultraviolet rays. In the present specification, 'reflection' in the liquid crystal layer 3 involves diffraction inside the liquid crystal layer 3.

The first protective layer 11 overlaps the liquid crystal layer 3 in the first direction A1. That is, the liquid crystal layer 3 is located between the alignment film 2 and the first protective layer 11, and contacts the alignment film 2 and the first protective layer 11. In addition, the first protective layer 11 is transparent and has high optical transparency especially to visible light.

The first protective layer 11 is formed of a water-soluble polymer or a fluorine-based resin.

The water-soluble polymer in the present specification is a polymeric material that exhibits solubility in water, which is a solvent having low compatibility with the liquid crystal layer 3. As examples of the polymeric material, synthetic polymers, such as sodium polyacrylate, polyacrylamide, polyvinyl alcohol, polyethyleneimine, polyethylene oxide, and polyvinylpyrrolidone, can be applied. In addition, as other examples of the polymeric material, cellulosic semi-synthetic polymers, such as carboxymethyl cellulose, hydroxyethyl cellulose, and hydroxypropyl cellulose, can be applied. Moreover, as other examples of the polymeric material, starch-based semi-synthetic polymers, such as oxidized starch and modified starch, can be applied.

The fluorine-based resin in the present specification is a resin for which a fluorine-based solution is used as a solvent.

The optical action of the liquid crystal optical element 100 in Embodiment 1 illustrated in FIG. 1 will be described next.

Light LTi incident on the liquid crystal optical element 100 includes, for example, visible light V, ultraviolet rays U, and infrared rays I.

In the example illustrated in FIG. 1, to facilitate understanding, it is assumed that light LTi is incident substantially perpendicularly to the optical waveguide 1. The angle of incidence of light LTi to the optical waveguide 1 is not particularly limited. For example, light LTi may be incident on the optical waveguide 1 at angles of incidence different from each other.

Light LTi enters the inside of the optical waveguide 1 from the first main surface F1, is emitted from the second main surface F2, is transmitted through the alignment film 2, and is incident on the liquid crystal layer 3. Then, the liquid crystal layer 3 reflects light LTr, which is part of light LTi, toward the optical waveguide 1, and transmits other light LTt. Here, any optical loss such as absorption in the optical waveguide 1 and the liquid crystal layer 3 is ignored.

Light LTr reflected by the liquid crystal layer 3 is, for example, first circularly polarized light of a predetermined wavelength. In addition, light LTt transmitted through the liquid crystal layer 3 includes second circularly polarized light of the predetermined wavelength and light of a wavelength different from the predetermined wavelength. The predetermined wavelength here is, for example, the wavelength of infrared rays I, and light LTr reflected by the liquid crystal layer 3 is first circularly polarized light I1 of infrared rays I. Light LTt transmitted through the liquid crystal layer 3 includes visible light V, ultraviolet rays U, and second circularly polarized light I2 of infrared rays I. In the present specification, circularly polarized light may be precise circularly polarized light or may be circularly polarized light approximate to elliptically polarized light.

The liquid crystal layer 3 reflects first circularly polarized light I1 toward the optical waveguide 1 at an angle θ of entry which satisfies the optical waveguide conditions in the optical waveguide 1. The angle θ of entry here corresponds to an angle greater than or equal to the critical angle θc which causes total reflection at the interface between the optical waveguide 1 and the air. The angle θ of entry represents an angle to a perpendicular line orthogonal to the optical waveguide 1.

If the optical waveguide 1, the alignment film 2, the liquid crystal layer 3, and the first protective layer 11 have equivalent refractive indices, they can be a single optical waveguide body. In this case, light LTr is guided toward the side surface F3 while being reflected repeatedly at the interface between the optical waveguide 1 and the air and the interface between the first protective layer 11 and the air.

According to Embodiment 1 as described above, the first protective layer 11 that overlaps the liquid crystal layer 3 is provided, thereby suppressing the damage to the liquid crystal layer 3. In addition, the undesirable scattering of light and the decrease in the reflectance of the liquid crystal layer 3 due to the damage to the liquid crystal layer 3 are suppressed. Accordingly, the decrease in the efficiency of light utilization is suppressed.

Figure 2:
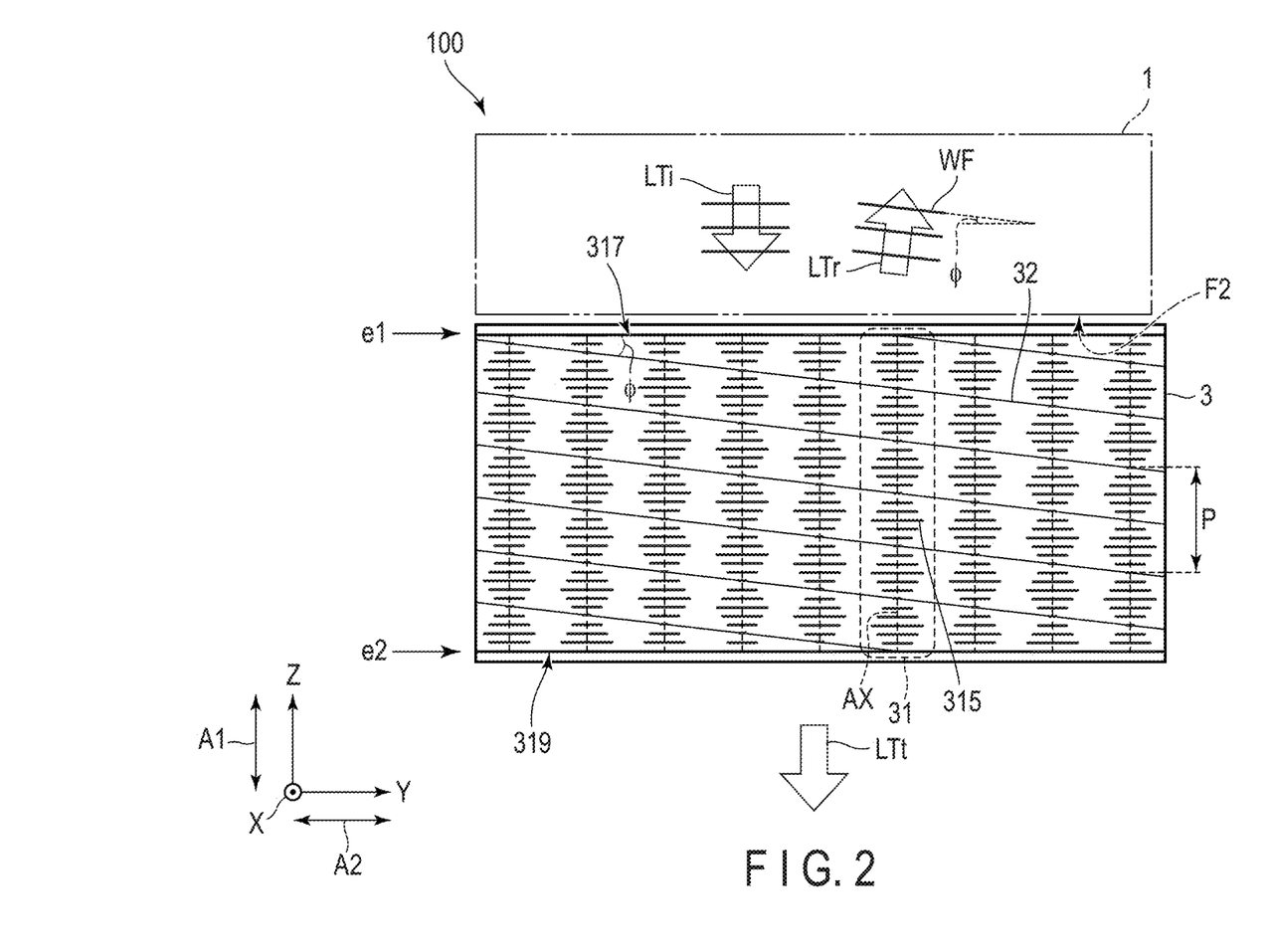
FIG. 2 is a cross-sectional view schematically illustrating the structure of a liquid crystal layer 3.

FIG. 2 is a cross-sectional view schematically illustrating the structure of the liquid crystal layer 3.

The optical waveguide 1 is indicated by a long dashed and double-short dashed line. In addition, the illustration of the alignment film and the first protective layer illustrated in FIG. 1 is omitted.

The liquid crystal layer 3 comprises cholesteric liquid crystals 31 as helical structures. Each of the cholesteric liquid crystals 31 has a helical axis AX substantially parallel to the first direction A1. The helical axis AX is substantially perpendicular to the second main surface F2 of the optical waveguide 1.

Each of the cholesteric liquid crystals 31 has a helical pitch P in the first direction A1. The helical pitch P indicates one cycle (360 degrees) of the helix. The helical pitch P is constant with hardly any change in the first direction A1. Each of the cholesteric liquid crystals 31 includes liquid crystal molecules 315. The liquid crystal molecules 315 are stacked helically in the first direction A1 while turning.

The liquid crystal layer 3 comprises a first boundary surface 317 opposed to the second main surface F2 in the first direction A1, a second boundary surface 319 on the opposite side to the first boundary surface 317, and reflective surfaces 32 between the first boundary surface 317 and the second boundary surface 319. The first boundary surface 317 is a surface through which light LTi transmitted through the optical waveguide 1 enters the liquid crystal layer 3. Each of the first boundary surface 317 and the second boundary surface 319 is substantially perpendicular to the helical axis AX of the cholesteric liquid crystals 31. Each of the first boundary surface 317 and the second boundary surface 319 is substantially parallel to the optical waveguide 1 (or the second main surface F2)

The first boundary surface 317 includes liquid crystal molecules 315 located at one end e1 of both ends of the cholesteric liquid crystals 31. The first boundary surface 317 corresponds to a boundary surface between the alignment film not illustrated in the figure and the liquid crystal layer 3.

The second boundary surface 319 includes liquid crystal molecules 315 located at the other end e2 of both ends of the cholesteric liquid crystals 31. The second boundary surface 319 corresponds to a boundary surface between the liquid crystal layer 3 and the first protective layer not illustrated in the figure.

In the example illustrated in FIG. 2, the reflective surfaces 32 are substantially parallel to each other. The reflective surfaces 32 are inclined with respect to the first boundary surface 317 and the optical waveguide 1 (or the second main surface F2), and have a substantially planar shape extending in one direction. The reflective surfaces 32 selectively reflect light LTr, which is part of light LTi incident through the first boundary surface 317, in accordance with Bragg's law. Specifically, the reflective surfaces 32 reflect light LTr such that the wave front WF of light LTr becomes substantially parallel to the reflective surfaces 32. More specifically, the reflective surfaces 32 reflect light LTr in accordance with the angle φ of inclination of the reflective surfaces 32 with respect to the first boundary surface 317.

The reflective surfaces 32 can be defined as follows. That is, the refractive index for light (for example, circularly polarized light) of a predetermined wavelength selectively reflected in the liquid crystal layer 3 changes gradually as the light travels through the inside of the liquid crystal layer 3. Thus, Fresnel reflection occurs gradually in the liquid crystal layer 3. In addition, Fresnel reflection occurs most strongly at the position where the refractive index for light changes most greatly in the cholesteric liquid crystals 31. That is, the reflective surfaces 32 correspond to the surfaces where Fresnel reflection occurs most strongly in the liquid crystal layer 3.

The alignment directions of the respective liquid crystal molecules 315 of cholesteric liquid crystals 31 adjacent to each other in the second direction A2 of the cholesteric liquid crystals 31 are different from each other. In addition, the respective spatial phases of cholesteric liquid crystals 31 adjacent to each other in the second direction A2 of the cholesteric liquid crystals 31 are different from each other. The reflective surfaces 32 correspond to the surfaces formed by the liquid crystal molecules 315 whose alignment directions are the same, or the surfaces along which the spatial phases are the same (equiphase wave surfaces). That is, each of the reflective surfaces 32 is inclined with respect to the first boundary surface 317 or the optical waveguide 1.

The shape of the reflective surfaces 32 is not limited to a planar shape as illustrated in FIG. 2, but may be a curved surface such as a concave shape or a convex shape and is not particularly limited. In addition, part of the reflective surfaces 32 may have irregularities, or the angles φ of inclination of the reflective surfaces 32 may not be uniform, or the reflective surfaces 32 may not be arranged regularly. According to the spatial phase distribution of the cholesteric liquid crystals 31, the reflective surfaces 32 having an arbitrary shape can be formed.

FIG. 2 illustrates the liquid crystal molecules 315 aligned in the average alignment directions as representatives of the liquid crystal molecules 315 located in the X-Y plane, for simplification of the drawing.

The cholesteric liquid crystals 31 reflect circularly polarized light of the same turning direction as that of the cholesteric liquid crystals 31, of light of a predetermined wavelength λ included in a selective reflection band Δλ. For example, if the turning direction of the cholesteric liquid crystals 31 is right-handed, they reflect right-handed circularly polarized light and transmit left-handed circularly polarized light, of light of the predetermined wavelength λ. Similarly, if the turning direction of the cholesteric liquid crystals 31 is left-handed, they reflect left-handed circularly polarized light and transmit right-handed circularly polarized light, of light of the predetermined wavelength λ.

The selective reflection band Δλ of the cholesteric liquid crystals 31 for perpendicularly incident light is generally expressed as "no*P to ne*P", where P represents the helical pitch of the cholesteric liquid crystals 31, ne represents the refractive index for extraordinary light of the liquid crystal molecules 315, and no represents the refractive index for ordinary light of the liquid crystal molecules 315. Specifically, the selective reflection band Δλ of the cholesteric liquid crystals 31 varies in the range of "no*P to ne*P" according to the angle φ of inclination of the reflective surfaces 32, the angle of incidence on the first boundary surface 317, etc.

Figure 3:
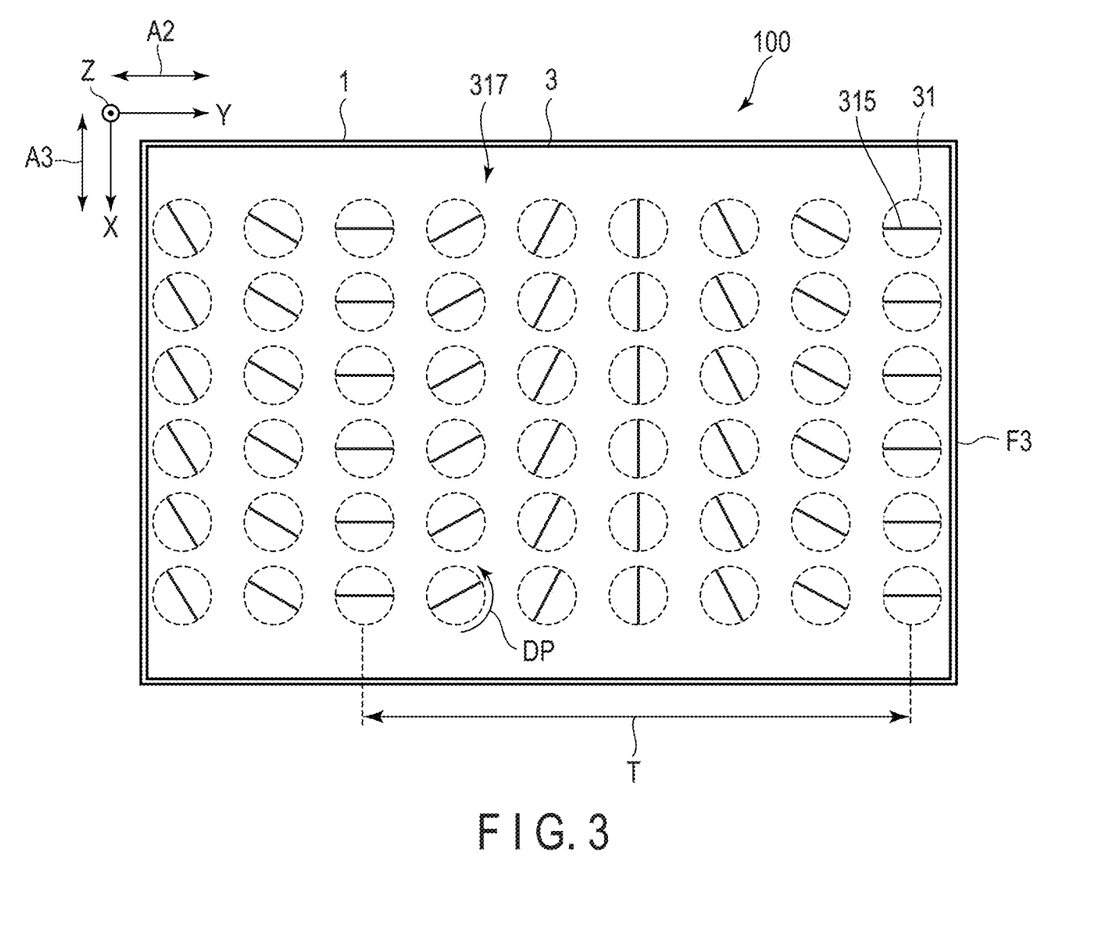
FIG. 3 is a plan view schematically illustrating the liquid crystal optical element 100.

FIG. 3 is a plan view schematically illustrating the liquid crystal optical element 100.

FIG. 3 illustrates an example of the spatial phases of the cholesteric liquid crystals 31. The spatial phases here are illustrated as the alignment directions of the liquid crystal molecules 315 located in the first boundary surface 317 of the liquid crystal molecules 315 included in the cholesteric liquid crystals 31.

As for the cholesteric liquid crystals 31 arranged in the second direction A2, the alignment directions of the liquid crystal molecules 315 located in the first boundary surface 317 are different from each other. That is, the spatial phases of the cholesteric liquid crystals 31 in the first boundary surface 317 are different in the second direction A2.

In contrast, as for the cholesteric liquid crystals 31 arranged in the third direction A3, the alignment directions of the liquid crystal molecules 315 located in the first boundary surface 317 are substantially identical. That is, the spatial phases of the cholesteric liquid crystals 31 in the first boundary surface 317 are substantially identical in the third direction A3.

In particular, as for the cholesteric liquid crystals 31 arranged in the second direction A2, the respective alignment directions of the liquid crystal molecules 315 differ by equal angles. That is, in the first boundary surface 317, the alignment directions of the liquid crystal molecules 315 arranged in the second direction A2 change linearly. Accordingly, the spatial phases of the cholesteric liquid crystals 31 arranged in the second direction A2 change linearly in the second direction A2. As a result, the reflective surfaces 32 inclined with respect to the first boundary surface 317 and the optical waveguide 1 are formed as in the liquid crystal layer 3 illustrated in FIG. 2. The phrase 'linearly change' here means, for example, that the amount of change of the alignment directions of the liquid crystal molecules 315 is represented by a linear function. The alignment directions of the liquid crystal molecules 315 here correspond to the directions of the major axes of the liquid crystal molecules 315 in the X-Y plane. The alignment directions of the liquid crystal molecules 315 as described above are controlled by the alignment treatment performed for the alignment film 2.

Here, as illustrated in FIG. 3, in the first boundary surface 317, the interval between two cholesteric liquid crystals 31 between which the alignment directions of the liquid crystal molecules 315 change by 180 degrees in the second direction A2 is defined as a cycle T of the cholesteric liquid crystals 31. In FIG. 3, DP denotes the turning direction of the liquid crystal molecules 315. The angle q of inclination of the reflective surfaces 32 illustrated in FIG. 2 is set as appropriate by the cycle T and the helical pitch P.

The liquid crystal layer 3 is formed in the following manner. For example, the liquid crystal layer 3 is formed by applying a liquid crystal material to the alignment film 2, which has been subjected to predetermined alignment treatment, and then irradiating the liquid crystal molecules 315 with light and polymerizing the liquid crystal molecules 315. Alternatively, the liquid crystal layer 3 is formed by controlling the alignment of a polymeric liquid crystal material that exhibits a liquid crystalline state at a predetermined temperature or a predetermined concentration to form the cholesteric liquid crystals 31 and then causing them to transition to a solid while maintaining the alignment.

In the liquid crystal layer 3, the cholesteric liquid crystals 31 adjacent to each other are coupled to each other while maintaining the alignment of the cholesteric liquid crystals 31, that is, while maintaining the spatial phases of the cholesteric liquid crystals 31, by polymerization or transition to a solid. As a result, in the liquid crystal layer 3, the respective alignment directions of the liquid crystal molecules 315 are fixed.

For example, a case where the helical pitch P of the cholesteric liquid crystals 31 is adjusted to set the selective reflection band Δλ to the wavelength band of infrared rays will be described. In order to increase the reflectance at the reflective surfaces 32 of the liquid crystal layer 3, it is desirable that the thickness in the first direction A1 of the liquid crystal layer 3 be set to approximately several times to ten times the helical pitch P. That is, the thickness of the liquid crystal layer 3 is approximately 1 to 10 μm and should preferably be 2 to 7 μm.

Here, a case where the first protective layer 11 that contacts the liquid crystal layer 3 is formed using a solvent having high compatibility with the liquid crystal layer 3 will be described.

When an aqueous solution for forming the first protective layer 11 is applied to the liquid crystal layer 3, a polymeric material forming the first protective layer 11 also easily penetrates the liquid crystal layer 3 as the solvent penetrates the liquid crystal layer 3, so that the liquid crystal layer 3 expands. As the liquid crystal layer 3 expands, the helical pitch of the cholesteric liquid crystals 31 enlarges in the first direction A1. While the solvent that has penetrated the liquid crystal layer 3 evaporates in a drying step later, the polymeric material that has penetrated the liquid crystal layer 3 remains in the liquid crystal layer 3 and the helical pitch in an enlarged state is maintained. As described above, the selective reflection band Δλ of the cholesteric liquid crystals 31 depends on the helical pitch. Thus, when the selective reflection bands Δλ before and after the formation of the first protective layer 11 are compared, the selective reflection band Δλ shifts to a long wavelength side because of the enlargement of the helical pitch after the formation of the first protective layer 11.

In view of the above, in the present embodiment, the first protective layer 11 that contacts the liquid crystal layer 3 is formed using a solvent having low compatibility with the liquid crystal layer 3 as described above. Thus, the components (solvent and polymeric material) constituting the first protective layer 11 hardly penetrate the liquid crystal layer 3.

Figure 4:
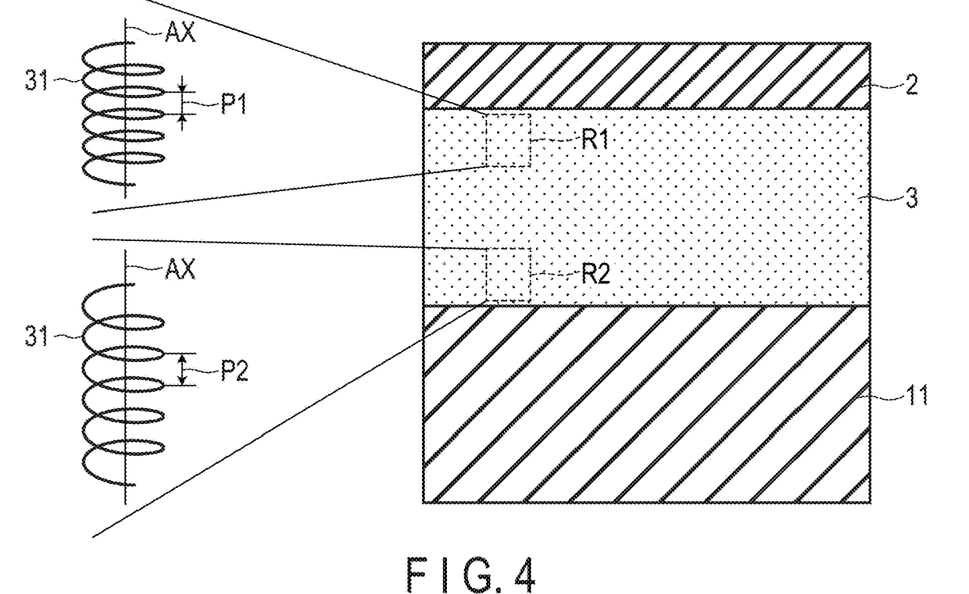
FIG. 4 is a diagram schematically illustrating the liquid crystal layer 3 in the present embodiment.

FIG. 4 is a diagram schematically illustrating the liquid crystal layer 3 in the present embodiment.

The liquid crystal layer 3 has a first region R1 close to the alignment film 2 and a second region R2 close to the first protective layer 11. The second region R2 is a region between the first region R1 and the first protective layer 11.

The cholesteric liquid crystals 31 have a first helical pitch P1 in the first region R1 and a second helical pitch P2 in the second region R2.

In the process of forming the first protective layer 11, an aqueous solution for forming the first protective layer 11 hardly penetrates the liquid crystal layer 3. Thus, the interface between the liquid crystal layer 3 and the first protective layer 11 (second boundary surface 319 of FIG. 2) is substantially flat. In addition, in the liquid crystal layer 3, there is hardly any sign that the solvent and polymeric material for forming the first protective layer 11 have penetrated the first region R1 and the second region R2. That is, the liquid crystal layer 3 includes hardly any component constituting the first protective layer 11. Moreover, the expansion of the liquid crystal layer 3 in the process of forming the first protective layer 11 is suppressed, and the enlargement of the helical pitch of the cholesteric liquid crystals 31 is suppressed. That is, the helical pitch of the cholesteric liquid crystals 31 before the formation of the first protective layer 11 is maintained.

Since the first region R1 is located closer to the alignment film 2 than the second region R2, it is strongly affected by the alignment restriction force of the alignment film 2. Thus, when the first helical pitch P1 and the second helical pitch P2 are compared, the second helical pitch P2 can be greater than the first helical pitch P1, but the difference is slight. For example, the difference ΔP between the first helical pitch P1 and the second helical pitch P2 is 20 nm or less. If the difference ΔP is 20 nm or less, the cholesteric liquid crystals 31 can be regarded as having a substantially constant pitch in the first direction A1.

If the components constituting the first protective layer 11 slightly penetrate the liquid crystal layer 3, the cholesteric liquid crystals 31 expand locally in the second region R2 close to the first protective layer 11, and the difference ΔP between the first helical pitch P1 and the second helical pitch P2 exceeds 20 nm. In other words, if the difference ΔP is 20 nm or less, the liquid crystal layer 3 can be regarded as including hardly any component constituting the first protective layer 11.

An example of a method for manufacturing the liquid crystal optical element 100 will be described here.

First, the alignment film 2 is formed on the optical waveguide 1 (or the second main surface F2). The alignment film 2 is subjected to predetermined alignment treatment.

Then, the liquid crystal layer 3 comprising the cholesteric liquid crystals 31 is formed on the alignment film 2 (upper surface on the opposite side to the surface that contacts the optical waveguide 1). The method for forming the liquid crystal layer 3 is as described above.

Then, the first protective layer 11 is formed on the liquid crystal layer 3.

Here, a case where the first protective layer 11 is formed of polyvinyl alcohol (PVA), which is one of the water-soluble polymers, will be described. The degree of polymerization of polyvinyl alcohol (made by Kanto Chemical Co., Inc.) used is 500, and its degree of saponification is 86.5% to 89%. The polyvinyl alcohol in powder form is dissolved in pure water to prepare a polyvinyl alcohol aqueous solution with a concentration of 15 wt %.

Then, the polyvinyl alcohol aqueous solution is uniformly applied to the surface of the liquid crystal layer 3 using a bar coater or the like. After that, pure water is removed by natural drying or heating (for example, at 125° C. for three minutes), and the first protective layer 11 made of polyvinyl alcohol is thereby formed.

In the liquid crystal optical element 100 formed through the above-described process, for example, the thickness of the alignment film 2 is 110 nm, the thickness of the liquid crystal layer 3 is 4.1 μm, and the thickness of the first protective layer 11 is 2.4 μm. In this example, the thickness of the liquid crystal layer 3 is greater than the thickness of the first protective layer 11.

Figure 5:
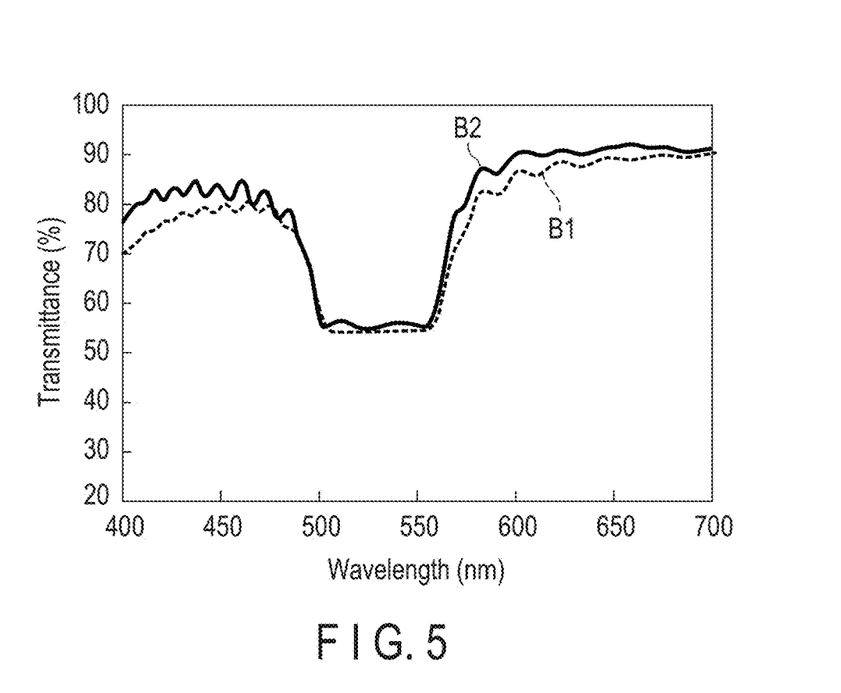
FIG. 5 is a diagram illustrating measurement results of transmission spectra before and after the formation of a first protective layer 11.

In the liquid crystal optical element 100 as described above, the transmission spectra before and after the formation of the first protective layer 11 were measured.

FIG. 5 is a diagram illustrating measurement results of the transmission spectra before and after the formation of the first protective layer 11.

The horizontal axis of FIG. 5 represents wavelength (nm) and the vertical axis of FIG. 5 represents transmittance (%). B1 in FIG. 5 represents the measurement result of the transmission spectrum before the formation of the first protective layer 11. B2 in FIG. 5 represents the measurement result of the transmission spectrum after the formation of the first protective layer 11.

The measurement results illustrated in the figure have confirmed that before and after the formation of the first protective layer 11, the selective reflection band Δλ was 500 nm to 560 nm and hardly changed.

The relationship between the thickness of the liquid crystal layer 3 and the thickness of the first protective layer 11 is as follows.

The thickness of the liquid crystal layer 3 is 1 μm to 10 μm and should preferably be 2 μm to 7 μm. While the thickness of the liquid crystal layer 3 should desirably be several times to ten times the helical pitch P as described above, the reflectance tends not to increase any more, even if the thickness of the liquid crystal layer 3 exceeds ten times the helical pitch P.

The thickness of the first protective layer 11 is 1 μm to 1,000 μm and should preferably be 2 μm to 100 μm. As the thickness of the first protective layer 11 becomes greater, the protective performance increases, but this may cause a decrease in productivity. As in the above-described example, it has been confirmed even if the thickness of the first protective layer 11 is 2.4 μm, sufficient protective performance is exhibited.

As described above, according to Embodiment 1, the first protective layer 11 that overlaps the liquid crystal layer 3 is provided, thereby suppressing the damage to the liquid crystal layer 3 and suppressing the decrease in the efficiency of light utilization. In addition, since the first protective layer 11 is formed of a material having low compatibility with the liquid crystal layer 3, the helical pitch of the cholesteric liquid crystals 31 included in the liquid crystal layer 3 hardly changes before and after the formation of the first protective layer 11. Thus, desired reflective performance can be achieved.

Modified Example

Figure 6:
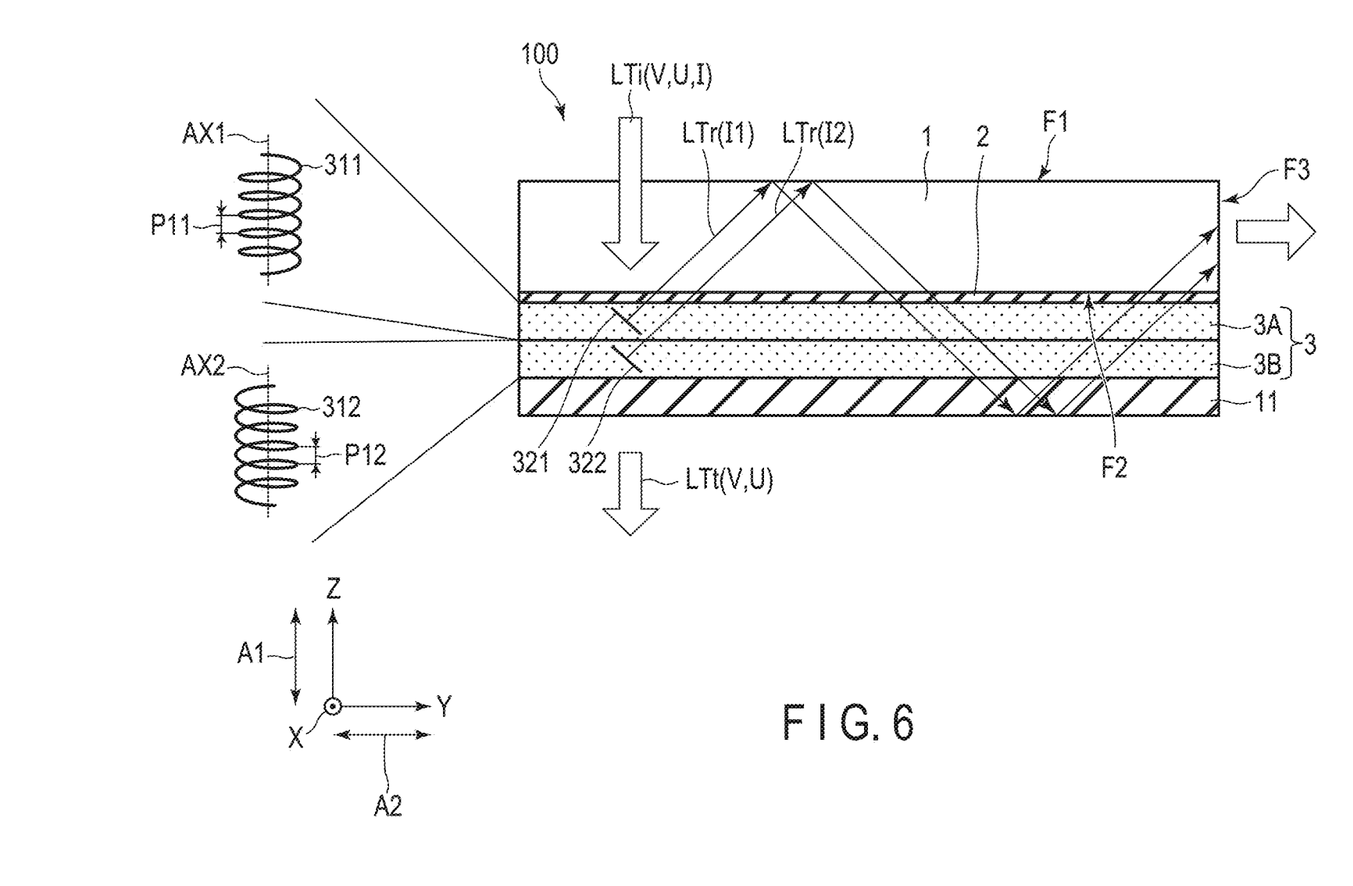
FIG. 6 is a cross-sectional view schematically illustrating a modified example of the liquid crystal optical element 100 according to Embodiment 1.

FIG. 6 is a cross-sectional view schematically illustrating a modified example of the liquid crystal optical element 100 according to Embodiment 1. The example illustrated in FIG. 6 is different from the example illustrated in FIG. 1 in that the liquid crystal layer 3 comprises a first layer 3A comprising a cholesteric liquid crystal 311 turning in a first turning direction and a second layer 3B comprising a cholesteric liquid crystal 312 turning in a second turning direction opposite to the first turning direction. The first layer 3A and the second layer 3B overlap in the first direction A1. The first layer 3A is located between the alignment film 2 and the second layer 3B, and the second layer 3B is located between the first layer 3A and the first protective layer 11.

The cholesteric liquid crystal 311 included in the first layer 3A is configured to reflect first circularly polarized light of the first turning direction of the selective reflection band. The cholesteric liquid crystal 311 has a helical axis AX1 substantially parallel to the first direction A1 and has a helical pitch P11 in the first direction A1.

The cholesteric liquid crystal 312 included in the second layer 3B is configured to reflect second circularly polarized light of the second turning direction of the selective reflection band. The cholesteric liquid crystal 312 has a helical axis AX2 substantially parallel to the first direction A1 and has a helical pitch P12 in the first direction A1. The helical axis AX1 is parallel to the helical axis AX2. The helical pitch P11 is equal to the helical pitch P12.

The cholesteric liquid crystals 311 and 312 are both formed to reflect infrared rays I as the selective reflection band as schematically illustrated in an enlarged manner. The cholesteric liquid crystal 311 of the first layer 3A forms a reflective surface 321 which reflects first circularly polarized light I1 of infrared rays I. The cholesteric liquid crystal 312 of the second layer 3B forms a reflective surface 322 which reflects second circularly polarized light I2 of infrared rays I in the second layer 3B.

In the liquid crystal optical element 100 as described above, when light LTi including visible light V, ultraviolet rays U, and infrared rays I is incident, the liquid crystal layer 3 reflects light LTr including infrared rays I and transmits light LTt including visible light V and ultraviolet rays U.

The reflective surface 321 formed in the first layer 3A of the liquid crystal layer 3 reflects first circularly polarized light I1 of infrared rays I toward the optical waveguide 1. In addition, the reflective surface 322 formed in the second layer 3B of the liquid crystal layer 3 reflects second circularly polarized light I2 of infrared rays I transmitted through the first layer 3A toward the optical waveguide 1. Light LTr including first circularly polarized light I1 and second circularly polarized light I2 reflected by the liquid crystal layer 3 is guided toward the side surface F3 while being reflected by the interface between the optical waveguide 1 and the air and the interface between the first protective layer 11 and the air.

In the modified example as described above, not only first circularly polarized light I1 but also second circularly polarized light of infrared rays I can be guided, and the efficiency of light utilization can be further improved.

The liquid crystal layer 3 may be a multilayer body of three or more layers. In addition, the helical pitches of the layers constituting the liquid crystal layer 3 may be different.

Embodiment 2

Figure 7:
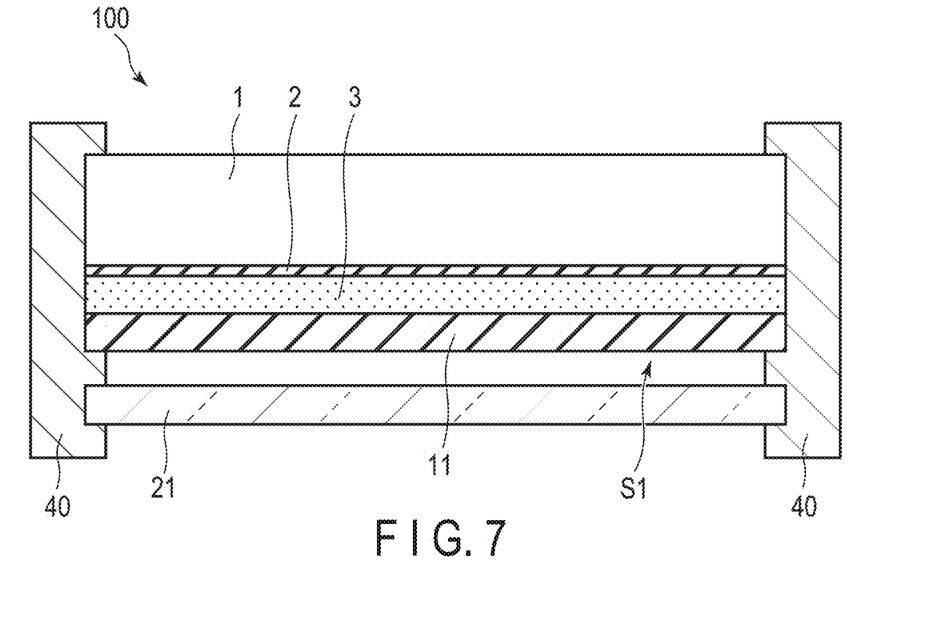
FIG. 7 is a cross-sectional view schematically illustrating a liquid crystal optical element 100 according to Embodiment 2.

FIG. 7 is a cross-sectional view schematically illustrating a liquid crystal optical element 100 according to Embodiment 2.

Embodiment 2 illustrated in FIG. 7 is different from Embodiment 1 illustrated in FIG. 1 in that a transparent first cover member 21 opposed to a first protective layer 11 is provided.

The first cover member 21 is a transparent flat plate and is, for example, a glass plate or an acrylic plate. The thickness of the first cover member 21 is 0.1 mm to 25 mm and should preferably be 1 mm to 20 mm.

A support body 40 supports the stacked layer body of an optical waveguide 1, an alignment film 2, a liquid crystal layer 3, and the first protective layer 11, and the first cover member 21. In addition, the support body 40 supports the first cover member 21 in a state in which a space S1 is formed between the first protective layer 11 and the first cover member 21. The space S1 is, for example, an air layer and is a low-refractive-index layer having a refractive index lower than those of the first protective layer 11 and the first cover member 21.

In Embodiment 2, too, the same advantages as those of Embodiment 1, described above, are achieved. In addition, the first protective layer 11 is shielded from the air by the first cover member 21, so that the entry of moisture into the liquid crystal layer 3 through the first protective layer 11 is suppressed, even if the first protective layer 11 is formed of a material having hygroscopicity. Accordingly, the degradation over time of the reflective performance in the liquid crystal layer 3 is suppressed.

Although the first cover member 21 is separated from the first protective layer 11 in the example illustrated in the figure, the first cover member 21 may contact the first protective layer 11.

Embodiment 3

Figure 8:
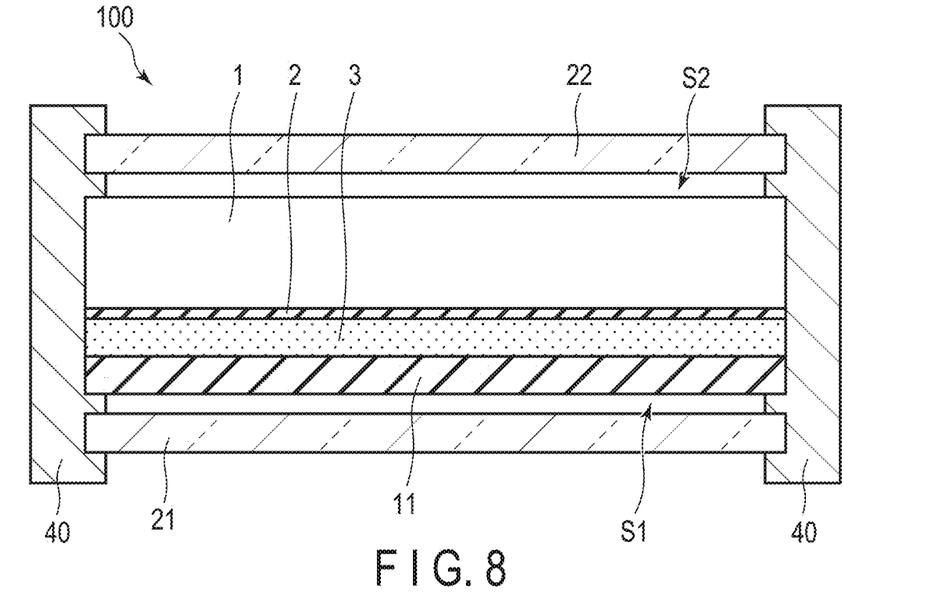
FIG. 8 is a cross-sectional view schematically illustrating a liquid crystal optical element 100 according to Embodiment 3.

FIG. 8 is a cross-sectional view schematically illustrating a liquid crystal optical element 100 according to Embodiment 3.

Embodiment 3 illustrated in FIG. 8 is different from Embodiment 2 illustrated in FIG. 7 in that a transparent second cover member 22 opposed to an optical waveguide 1 is further provided. The stacked layer body of the optical waveguide 1, an alignment film 2, a liquid crystal layer 3, and a first protective layer 11 is provided between a first cover member 21 and the second cover member 22.

The second cover member 22 is a transparent flat plate and is, for example, a glass plate or an acrylic plate. The thickness of the second cover member 22 is 0.1 mm to 25 mm and should preferably be 1 mm to 20 mm.

A support body 40 supports the stacked layer body of the optical waveguide 1, the alignment film 2, the liquid crystal layer 3, and the first protective layer 11, the first cover member 21, and the second cover member 22. In addition, the support body 40 supports the second cover member 22 in a state in which a space S2 is formed between the optical waveguide 1 and the second cover member 22. The space S2 is, for example, an air layer and is a low-refractive-index layer having a refractive index lower than those of the optical waveguide 1 and the second cover member 22.

In Embodiment 3, too, the same advantages as those of Embodiment 2, described above, are achieved. In addition, the optical waveguide 1 is protected by the second cover member 22, so that the damage to the optical waveguide 1 and the undesirable scattering of light in the optical waveguide 1 are suppressed.

Although the second cover member 22 is separated from the optical waveguide 1 in the example illustrated in the figure, the second cover member 22 may contact the optical waveguide 1.

Embodiment 4

Figure 9:
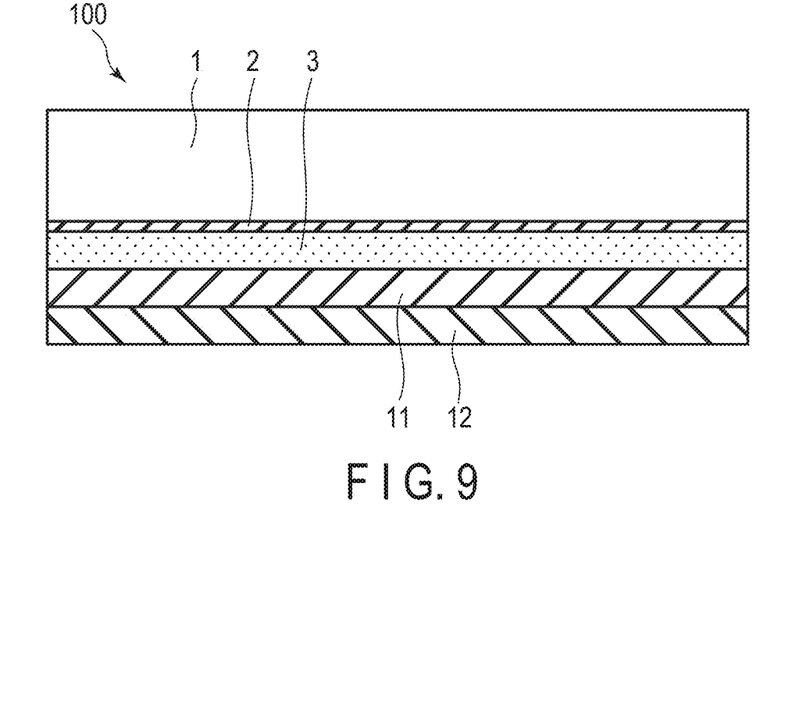
FIG. 9 is a cross-sectional view schematically illustrating a liquid crystal optical element 100 according to Embodiment 4.

FIG. 9 is a cross-sectional view schematically illustrating a liquid crystal optical element 100 according to Embodiment 4.

Embodiment 4 illustrated in FIG. 9 is different from Embodiment 1 illustrated in FIG. 1 in that a transparent second protective layer 12 overlapping a first protective layer 11 is provided. The first protective layer 11 is located between a liquid crystal layer 3 and the second protective layer 12, and contacts the liquid crystal layer 3 and the second protective layer 12.

The second protective layer 12 is formed of a material different from that of the first protective layer 11, and the moisture permeability of the second protective layer 12 is less than the moisture permeability of the first protective layer 11. The second protective layer 12 may be an organic film or may be an inorganic film.

As the organic film that can form the second protective layer 12, polyvinyl chloride (PVC), polyethylene (PE), cast polypropylene (CPP), biaxially-oriented polypropylene (OPP), biaxially-oriented polystyrene (OPS), polyvinylidene chloride (PVDC), acrylic resin, polyethylene terephthalate (PET), triacetylcellulose (TAC), polycarbonate (PC), aramid, polyethersulfone (PES), polyphenylene sulfide (PPS), polyimide (PI), polyurethane, fluorine resin, norbornene resin, cycloolefin-based resin can be applied, for example.

In addition, as the inorganic film that can form the second protective layer 12, silicon nitride (SiNx) and silicon oxide (Siox) can be applied, for example.

If the second protective layer 12 is an organic film, the thickness of the second protective layer 12 is 1 μm to 1,000 μm and should preferably be 2 μm to 100 μm.

If the second protective layer 12 is an inorganic film, the thickness of the second protective layer 12 is 10 nm to 10 μm and should preferably be 50 nm to 5 μm.

In Embodiment 4, too, the same advantages as those of Embodiment 1, described above, are achieved. In addition, since the second protective layer 12 having low moisture permeability overlaps substantially all the surface of the first protective layer 11, the entry of moisture into the liquid crystal layer 3 through the first protective layer 11 is suppressed, even if the first protective layer 11 is formed of a material having hygroscopicity. Accordingly, the degradation over time of the reflective performance in the liquid crystal layer 3 is suppressed.

Embodiment 5

Figure 10:
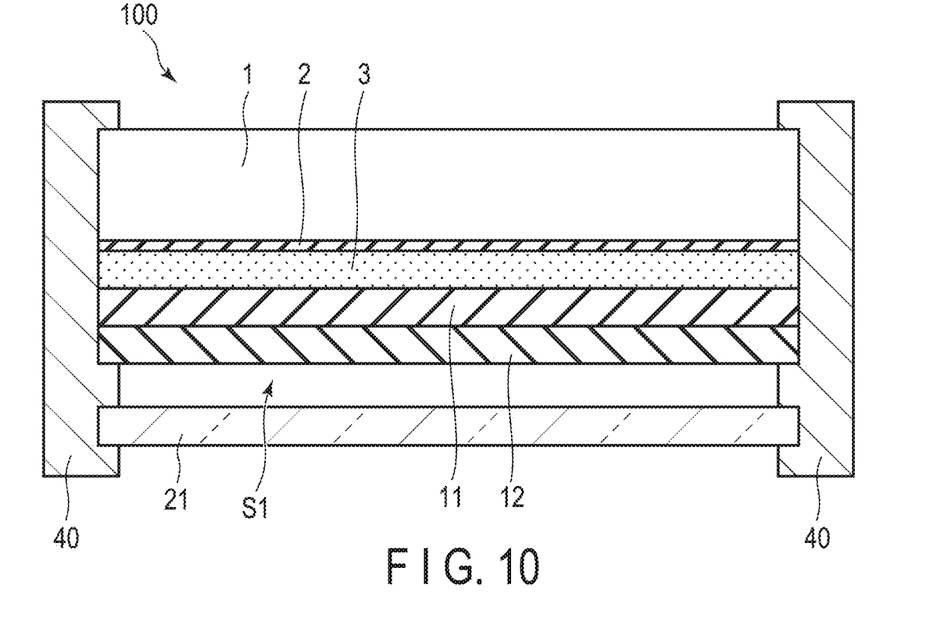
FIG. 10 is a cross-sectional view schematically illustrating a liquid crystal optical element 100 according to Embodiment 5.

FIG. 10 is a cross-sectional view schematically illustrating a liquid crystal optical element 100 according to Embodiment 5.

Embodiment 5 illustrated in FIG. 10 is different from Embodiment 4 illustrated in FIG. 9 in that a transparent first cover member 21 opposed to a second protective layer 12 is provided. Details of the first cover member 21 are as described in Embodiment 2.

A support body 40 supports the stacked layer body of an optical waveguide 1, an alignment film 2, a liquid crystal layer 3, a first protective layer 11, and the second protective layer 12, and the first cover member 21. In addition, the support body 40 supports the first cover member 21 in a state in which a space S1 is formed between the second protective layer 12 and the first cover member 21. The space S1 is a low-refractive-index layer such as an air layer.

In Embodiment 5, too, the same advantages as those of Embodiment 4, described above, are achieved. In addition, since the first protective layer 11 and the second protective layer 12 are shielded from the air by the first cover member 21, the entry of moisture into the liquid crystal layer 3 through the first protective layer 11 and the second protective layer 12 is suppressed. Accordingly, the degradation over time of the reflective performance in the liquid crystal layer 3 is suppressed.

Although the first cover member 21 is separated from the second protective layer 12 in the example illustrated in the figure, the first cover member 21 may contact the second protective layer 12.

Embodiment 6

Figure 11:
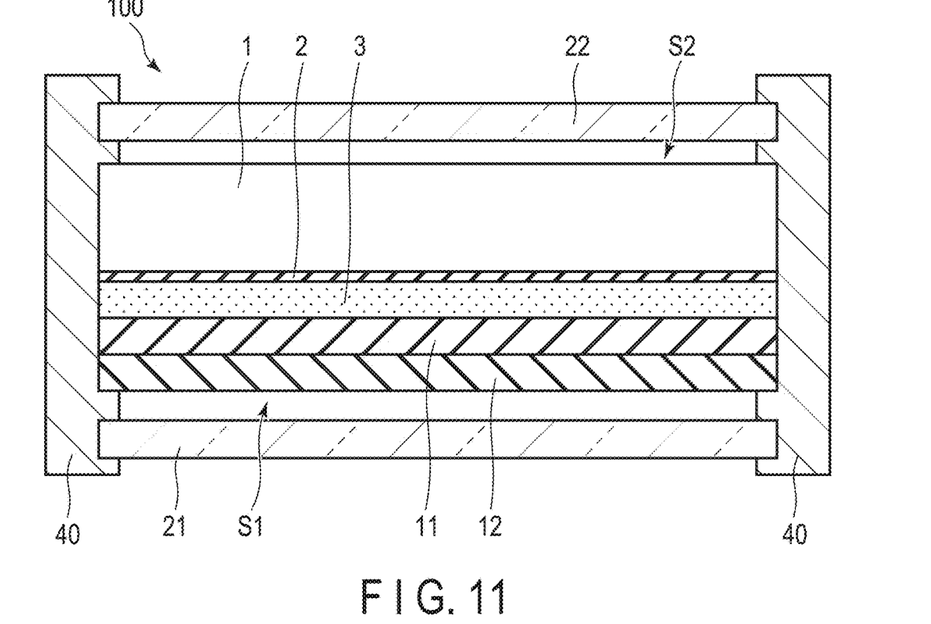
FIG. 11 is a cross-sectional view schematically illustrating a liquid crystal optical element 100 according to Embodiment 6.

FIG. 11 is a cross-sectional view schematically illustrating a liquid crystal optical element 100 according to Embodiment 6.

Embodiment 6 illustrated in FIG. 11 is different from Embodiment 5 illustrated in FIG. 10 in that a transparent second cover member 22 opposed to an optical waveguide 1 is further provided. Details of the second cover member 22 are as described in Embodiment 3. The stacked layer body of the optical waveguide 1, an alignment film 2, a liquid crystal layer 3, a first protective layer 11, and a second protective layer 12 is provided between a first cover member 21 and the second cover member 22.

A support body 40 supports the stacked layer body of the optical waveguide 1, the alignment film 2, the liquid crystal layer 3, the first protective layer 11, and the second protective layer 12, the first cover member 21, and the second cover member 22. In addition, the support body 40 supports the second cover member 22 in a state in which a space S2 is formed between the optical waveguide 1 and the second cover member 22. The space S2 is a low-refractive-index layer such as an air layer.

In Embodiment 6, too, the same advantages as those of Embodiment 5, described above, are achieved. In addition, since the optical waveguide 1 is protected by the second cover member 22, the damage to the optical waveguide 1 and the undesirable scattering of light in the optical waveguide 1 are suppressed.

Although the second cover member 22 is separated from the optical waveguide 1 in the example illustrated in the figure, the second cover member 22 may contact the optical waveguide 1.

The modified example described with reference to FIG. 6 can be applied to each of Embodiments 2 to 6, described above. That is, the liquid crystal layer 3 may be the multilayer body of the first layer 3A comprising the cholesteric liquid crystal 311 and the second layer 3B comprising the cholesteric liquid crystal 312. In addition, the liquid crystal layer 3 may be a multilayer body of three or more layers.

A photovoltaic cell device 200 will be described next as an application example of the liquid crystal optical elements 100 according to the present embodiments.

Figure 12:
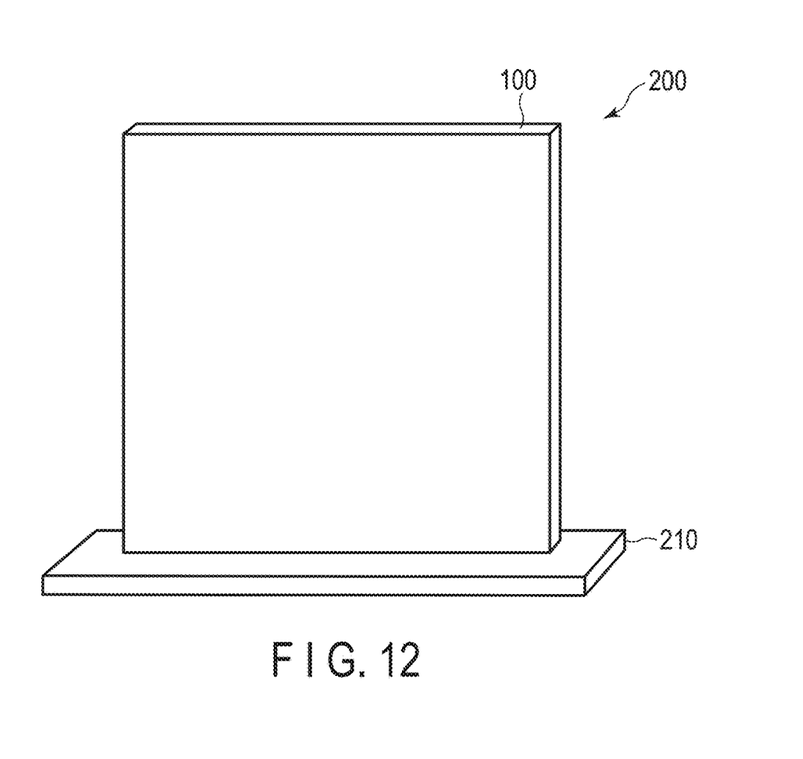
FIG. 12 is a diagram illustrating an example of the outside of a photovoltaic cell device 200.

FIG. 12 is a diagram illustrating an example of the outside of the photovoltaic cell device 200.

The photovoltaic cell device 200 comprises any one of the above-described liquid crystal optical elements 100 and a power generation device 210. The power generation device 210 is provided along one side of the liquid crystal optical element 100. The one side of the liquid crystal optical element 100, which is opposed to the power generation device 210, is a side along the side surface F3 of the optical waveguide 1 illustrated in FIG. 1, etc. In the photovoltaic cell device 200, the liquid crystal optical element 100 functions as a lightguide element which guides light of a predetermined wavelength to the power generation device 210.

The power generation device 210 comprises a plurality of photovoltaic cells. The photovoltaic cells receive light and convert the energy of received light into power. That is, the photovoltaic cells generate power from received light. The types of photovoltaic cell are not particularly limited. For example, the photovoltaic cells are silicon photovoltaic cells, compound photovoltaic cells, organic photovoltaic cells, perovskite photovoltaic cells, or quantum dot photovoltaic cells. The silicon photovoltaic cells include photovoltaic cells comprising amorphous silicon, photovoltaic cells comprising polycrystalline silicon, etc.

Figure 13:
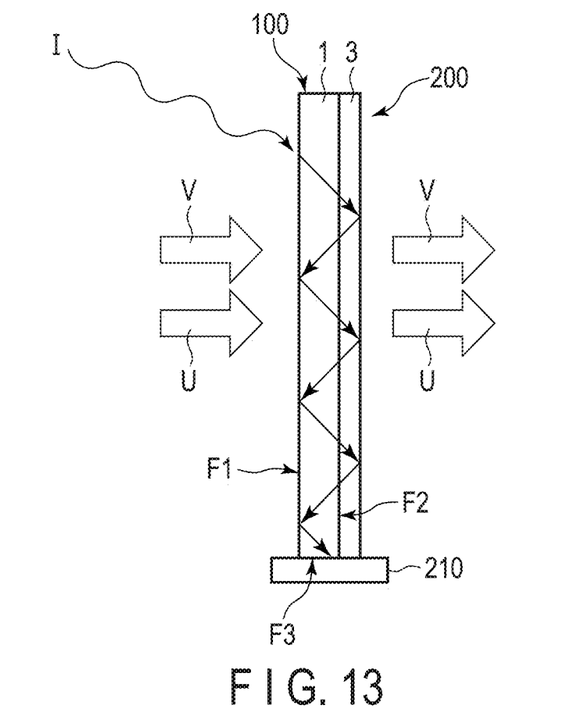
FIG. 13 is a diagram for explaining the operation of the photovoltaic cell device 200.

FIG. 13 is a diagram for explaining the operation of the photovoltaic cell device 200.

The first main surface F1 of the optical waveguide 1 faces outdoors. The liquid crystal layer 3 faces indoors. In FIG. 13, the illustration of the alignment film, the first protective layer, etc., is omitted.

The liquid crystal layer 3 is configured to reflect infrared rays I of solar light. The liquid crystal layer 3 may be configured to reflect first circularly polarized light I1 and transmit second circularly polarized light I2 of infrared rays I as illustrated in FIG. 1, or may be configured to reflect first circularly polarized light I1 and second circularly polarized light I2 of infrared rays I as illustrated in FIG. 6. Infrared rays I reflected by the liquid crystal layer 3 propagate through the liquid crystal optical element 100 toward the side surface F3. The power generation device 210 receives infrared rays I transmitted through the side surface F3 and generates power.

Visible light V and ultraviolet rays U of solar light are transmitted through the liquid crystal optical element 100. In particular, a first component (blue component), a second component (green component), and a third component (red component), which are main components of visible light V, are transmitted through the liquid crystal optical element 100. Thus, the coloration of light transmitted through the photovoltaic cell device 200 can be suppressed. In addition, the decrease in the transmittance of visible light V in the photovoltaic cell device 200 can be suppressed.

EXAMPLE

Figure 14:
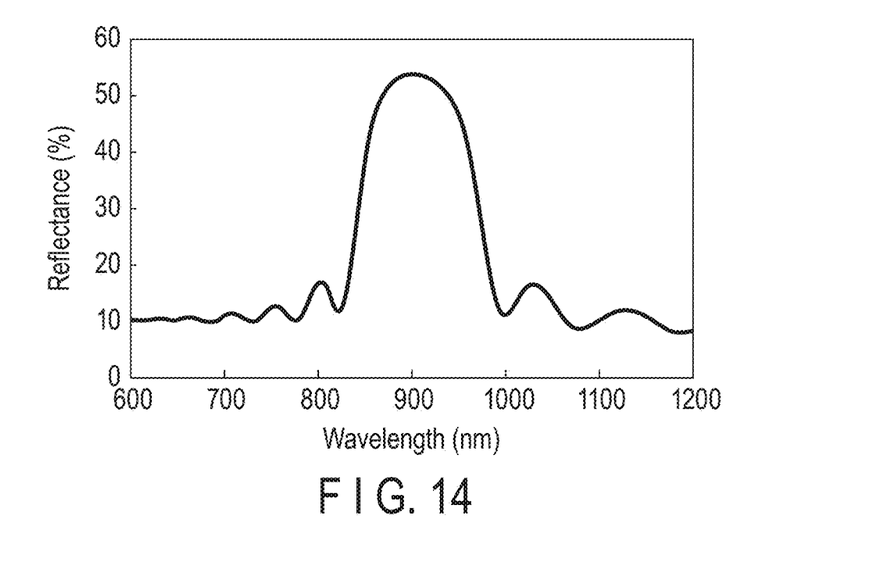
FIG. 14 is a diagram illustrating a measurement result of the reflection spectrum of the liquid crystal layer 3.

An example of the liquid crystal layer 3 formed to reflect first circularly polarized light of infrared rays will be described next.

FIG. 14 is a diagram illustrating a measurement result of the reflection spectrum of the liquid crystal layer 3.

The horizontal axis of the figure represents wavelength (nm) and the vertical axis of the figure represents reflectance (%).

In the liquid crystal layer 3, the refractive anisotropy Δn was 0.2, the average refractive index was 1.66, the helical pitch P of the cholesteric liquid crystals 31 was 530 nm, and the cycle T of the cholesteric liquid crystals 31 was 650 nm. On these conditions, the reflection spectrum of the liquid crystal layer 3 was measured to confirm that the selective reflection band Δλ was 820 nm to 1,000 nm. As described above, the present embodiments can provide a liquid crystal optical element which can achieve desired reflective performance and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A liquid crystal optical element comprising:
    an optical waveguide comprising a first main surface and a second main surface opposed to the first main surface;
    an alignment film disposed on the second main surface;
    a liquid crystal layer which overlaps the alignment film, which comprises cholesteric liquid crystals, and which reflects at least part of light incident through the optical waveguide toward the optical waveguide; and
    a transparent first protective layer which overlaps the liquid crystal layer, and which is formed of a water-soluble polymer or a fluorine-based resin.

2. The liquid crystal optical element of claim 1, wherein the cholesteric liquid crystals have a first helical pitch in a first region close to the alignment film and have a second helical pitch in a second region between the first region and the first protective layer, and
    a difference between the first helical pitch and the second helical pitch is 20 nm or less.

3. The liquid crystal optical element of claim 1, wherein a component constituting the first protective layer does not penetrate the liquid crystal layer.

4. The liquid crystal optical element of claim 1, wherein the first protective layer is formed of polyvinyl alcohol.

5. The liquid crystal optical element of claim 1, wherein the thickness of the liquid crystal layer is greater than the thickness of the first protective layer.

6. The liquid crystal optical element of claim 1, wherein the liquid crystal layer comprises a first layer and a second layer which are composed of the cholesteric liquid crystals, and
    in the first layer and the second layer, the cholesteric liquid crystals have an equal helical pitch and turn in opposite directions.

7. The liquid crystal optical element of claim 1, further comprising:
    a transparent first cover member opposed to the first protective layer; and
    a support body which supports the first cover member in a state in which a space is formed between the first protective layer and the first cover member.

8. The liquid crystal optical element of claim 7, further comprising a second cover member opposed to the optical waveguide, wherein
    the support body supports the second cover member in a state in which a space is formed between the optical waveguide and the second cover member.

9. The liquid crystal optical element of claim 1, further comprising a transparent second protective layer overlapping the first protective layer, wherein
    the second protective layer is formed of a material different from a material of the first protective layer, and
    the moisture permeability of the second protective layer is less than the moisture permeability of the first protective layer.

10. The liquid crystal optical element of claim 9, further comprising:
    a transparent first cover member opposed to the second protective layer; and
    a support body which supports the second protective layer and the first cover member in a state in which a space is formed between the second protective layer and the first cover member.

11. The liquid crystal optical element of claim 10, further comprising a second cover member opposed to the optical waveguide, wherein
    the support body supports the optical waveguide and the second cover member in a state in which a space is formed between the optical waveguide and the second cover member.

12. A method for manufacturing a liquid crystal optical element, comprising:
    forming an alignment film on an optical waveguide;
    forming a liquid crystal layer comprising cholesteric liquid crystals on the alignment film; and applying an aqueous solution prepared by dissolving polyvinyl alcohol in pure water, to the liquid crystal layer, and then drying the aqueous solution to form a first protective layer.

* * * * *